(12) United States Patent
Liu et al.

(10) Patent No.: US 10,140,498 B2
(45) Date of Patent: *Nov. 27, 2018

(54) WAFER-LEVEL PACKAGING SENSING DEVICE AND METHOD FOR FORMING THE SAME

(71) Applicant: XINTEC INC., Taoyuan (TW)

(72) Inventors: Tsang-Yu Liu, Zhubei (TW); Ying-Nan Wen, Hsinchu (TW); Chi-Chang Liao, Pingtung City (TW); Yu-Lung Huang, Taoyuan (TW)

(73) Assignee: XINTEC INC., Taoyuan (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/297,546

(22) Filed: Oct. 19, 2016

(65) Prior Publication Data

US 2017/0116458 A1   Apr. 27, 2017

Related U.S. Application Data

(60) Provisional application No. 62/244,599, filed on Oct. 21, 2015.

(51) Int. Cl.
*H01L 21/56* (2006.01)
*G06K 9/00* (2006.01)
(Continued)

(52) U.S. Cl.
CPC ..... *G06K 9/00013* (2013.01); *G06K 19/0716* (2013.01); *H01L 21/6835* (2013.01);
(Continued)

(58) Field of Classification Search
CPC ... H01L 21/563; H01L 21/56; H01L 21/6835; H01L 21/78; H01L 23/3114; H01L 23/3107; H01L 23/3128; H01L 23/3135; H01L 23/3142; H01L 24/81; H01L 24/82; H01L 24/83; G06K 9/00013; G06K 9/00006; G06K 9/0002
See application file for complete search history.

(56) References Cited

U.S. PATENT DOCUMENTS

| 9,274,553 | B2* | 3/2016 | Erhart | G06F 1/1626 |
| 9,400,911 | B2* | 7/2016 | Erhart | G06F 1/1626 |
| 9,711,425 | B2* | 7/2017 | Chang | H01L 23/3121 |

FOREIGN PATENT DOCUMENTS

TW     201246087     11/2012

* cited by examiner

Primary Examiner — Andrew Q Tran
(74) Attorney, Agent, or Firm — Liu & Liu

(57) ABSTRACT

A method for forming a sensing device includes providing a first substrate. The first substrate has a first surface and a second surface opposite thereto. A sensing region is adjacent to the first surface. A temporary cover plate is provided on the second surface to cover the sensing region. The method also includes forming a redistribution layer on the second surface and electrically connected to the sensing region. The method further includes removing the temporary cover plate after the formation of the redistribution layer. The first substrate is bonded to a second substrate and a cover plate after the removal of the temporary cover plate so that the first substrate is positioned between the second substrate and the cover plate. In addition, the method includes filling an encapsulating layer between the second substrate and the cover plate to surround the first substrate.

19 Claims, 7 Drawing Sheets

(51) Int. Cl.
*H01L 21/683* (2006.01)
*H01L 21/768* (2006.01)
*H01L 23/00* (2006.01)
*H01L 21/78* (2006.01)
*H01L 23/31* (2006.01)
*H01L 23/04* (2006.01)
*H01L 23/08* (2006.01)
*G06K 19/07* (2006.01)
*H01L 23/15* (2006.01)
*H01L 23/29* (2006.01)

(52) U.S. Cl.
CPC ........ *H01L 21/76895* (2013.01); *H01L 21/78* (2013.01); *H01L 23/04* (2013.01); *H01L 23/08* (2013.01); *H01L 23/3135* (2013.01); *H01L 24/03* (2013.01); *H01L 24/05* (2013.01); *H01L 24/29* (2013.01); *H01L 24/92* (2013.01); *H01L 24/94* (2013.01); *H01L 21/563* (2013.01); *H01L 21/6836* (2013.01); *H01L 23/15* (2013.01); *H01L 23/291* (2013.01); *H01L 23/293* (2013.01); *H01L 24/13* (2013.01); *H01L 24/81* (2013.01); *H01L 24/83* (2013.01); *H01L 2221/6834* (2013.01); *H01L 2221/68327* (2013.01); *H01L 2224/0239* (2013.01); *H01L 2224/02313* (2013.01); *H01L 2224/02372* (2013.01); *H01L 2224/03002* (2013.01); *H01L 2224/0345* (2013.01); *H01L 2224/0391* (2013.01); *H01L 2224/03452* (2013.01); *H01L 2224/03462* (2013.01); *H01L 2224/03464* (2013.01); *H01L 2224/0401* (2013.01); *H01L 2224/058* (2013.01); *H01L 2224/0579* (2013.01); *H01L 2224/05548* (2013.01); *H01L 2224/05573* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/11002* (2013.01); *H01L 2224/1132* (2013.01); *H01L 2224/131* (2013.01); *H01L 2224/13022* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16225* (2013.01); *H01L 2224/2919* (2013.01); *H01L 2224/32058* (2013.01); *H01L 2224/32225* (2013.01); *H01L 2224/73204* (2013.01); *H01L 2224/73253* (2013.01); *H01L 2224/81191* (2013.01); *H01L 2224/81192* (2013.01); *H01L 2224/81815* (2013.01); *H01L 2224/92225* (2013.01); *H01L 2224/94* (2013.01); *H01L 2924/351* (2013.01)

WAFER-LEVEL PACKAGING SENSING DEVICE AND METHOD FOR FORMING THE SAME

CROSS REFERENCE TO RELATED APPLICATIONS

This Application claims priority of U.S. Provisional Application No. 62/244,599, filed Oct. 21, 2015, the entirety of which is incorporated by reference herein.

BACKGROUND OF THE INVENTION

Field of the Invention

The invention relates to a sensing device and methods for forming the same, and in particular to a biometric sensing device formed by a wafer-level packaging process.

Description of the Related Art

The chip packaging process is an important step in the fabrication of an electronic product. Chip packages not only protect the chips therein from outer environmental contaminants, but they also provide electrical connection paths between electronic elements inside and those outside of the chip packages. A chip package with a sensing function and other electronic components are usually bonded together on a circuit board. As a result, a sensing device is formed. The sensing device is further combined into an electronic product.

However, the conventional processes of forming a sensing device are complicated and have a low yield. The sensing device is usually recessed from the shell of an electronic product, making it inconvenient to use. Furthermore, if the sensing chip or chip package is damaged or fails, the whole device will not work.

Thus, there exists a need to develop a novel sensing device and methods for forming the same capable of mitigating or eliminating the aforementioned problems.

BRIEF SUMMARY OF THE INVENTION

In accordance with some embodiments, a method for forming a sensing device is provided. The method includes providing a first substrate. The first substrate has a first surface and a second surface opposite thereto. A sensing region is adjacent to the first surface. The method also includes providing a temporary cover plate on the second surface to cover the sensing region. The method further includes forming a redistribution layer on the second surface and electrically connected to the sensing region. In addition, the method includes removing the temporary cover plate after the formation of the redistribution layer. The method also includes bonding the first substrate to a second substrate and a cover plate after the removal of the temporary cover plate so that the first substrate is positioned between the second substrate and the cover plate. The redistribution layer is electrically connected to the second substrate. The method further includes filling an encapsulating layer between the second substrate and the cover plate to surround the first substrate.

In accordance with some embodiments, a sensing device is provided. The sensing device includes a first substrate, a second substrate and a cover plate. The first substrate is between the second substrate and the cover plate. A sensing region is adjacent to a surface of the first substrate that faces the cover plate. The sensing device also includes a redistribution layer between the first substrate and the second substrate. The redistribution layer is electrically connected to the sensing region and the second substrate. The sensing device further includes an underfill layer between the redistribution layer and the second substrate. In addition, the sensing device includes an encapsulating layer surrounding the first substrate and the underfill layer.

In accordance with some embodiments, a sensing device is provided. The sensing device includes a substrate and a supporting substrate. The substrate has a first surface and a second surface opposite thereto. The substrate is carried on the supporting substrate. Sensing regions are adjacent to the first surface and are configured to sense biometrics. The sensing device also includes conducting structures on the second surface and electrically connected to the corresponding sensing regions. The conducting structures are electrically insulated from each other. The sensing device further includes a trench extending between the sensing regions and between the conducting structures, and exposing the supporting substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
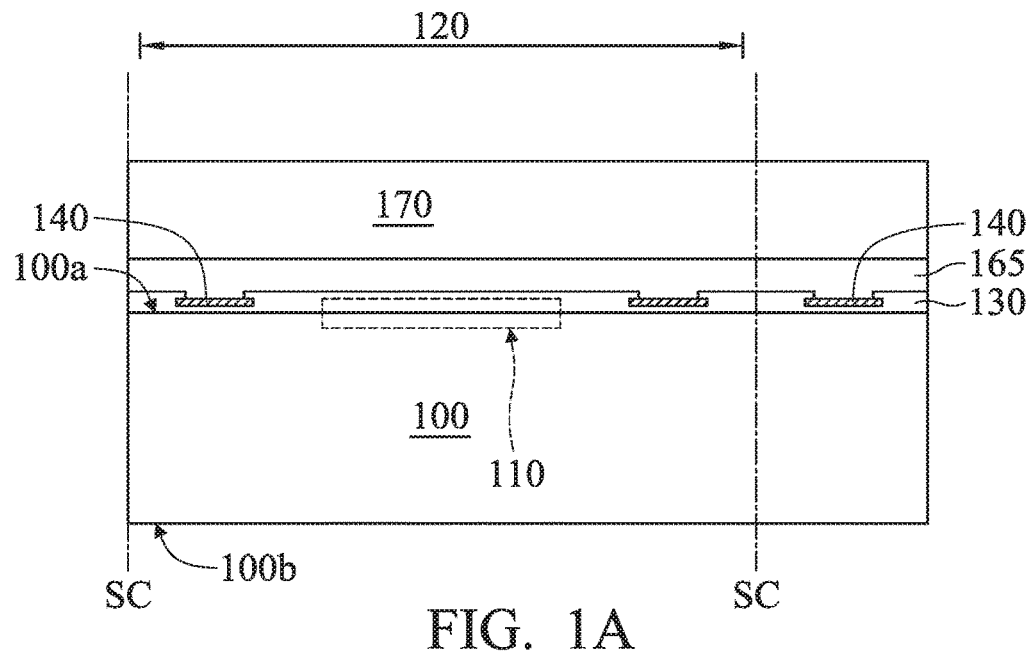
FIGS. 1A to 1E and 1G to 1I are cross-sectional views of some exemplary embodiments of a method for forming a sensing device according to the invention.
Figure 1B:
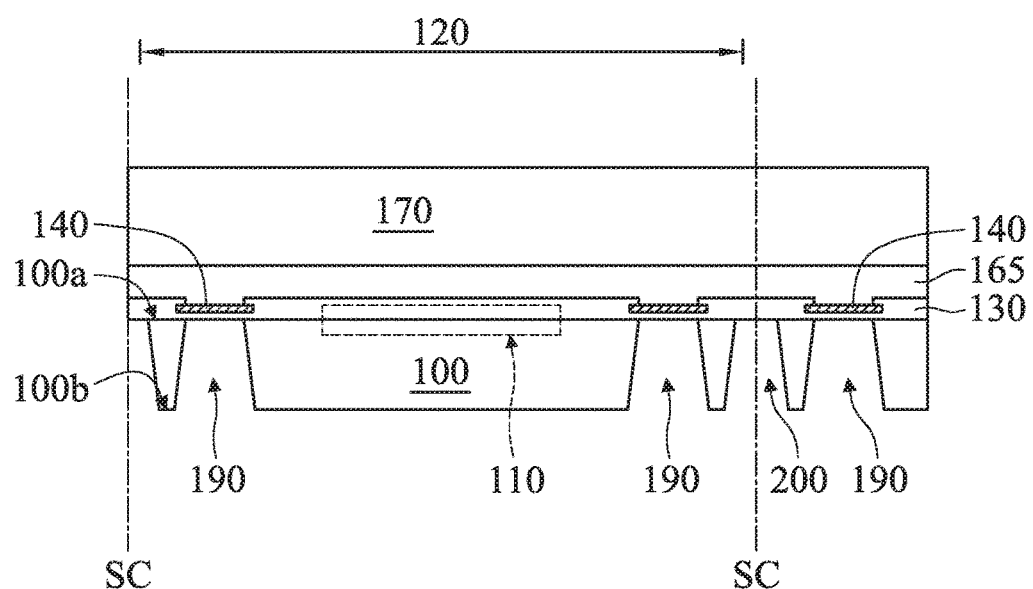
Figure 1C:
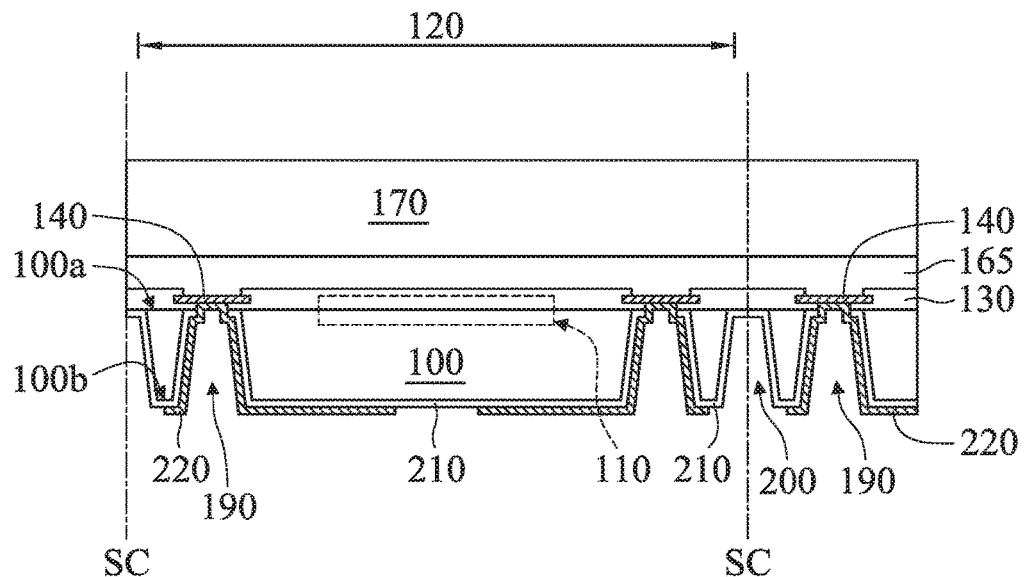
Figure 1D:
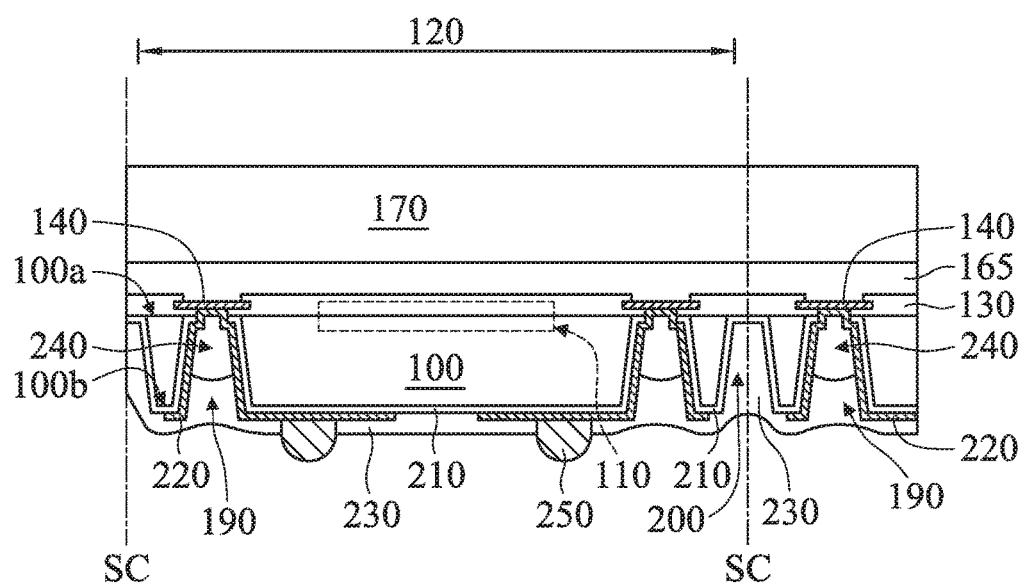
Figure 1E:
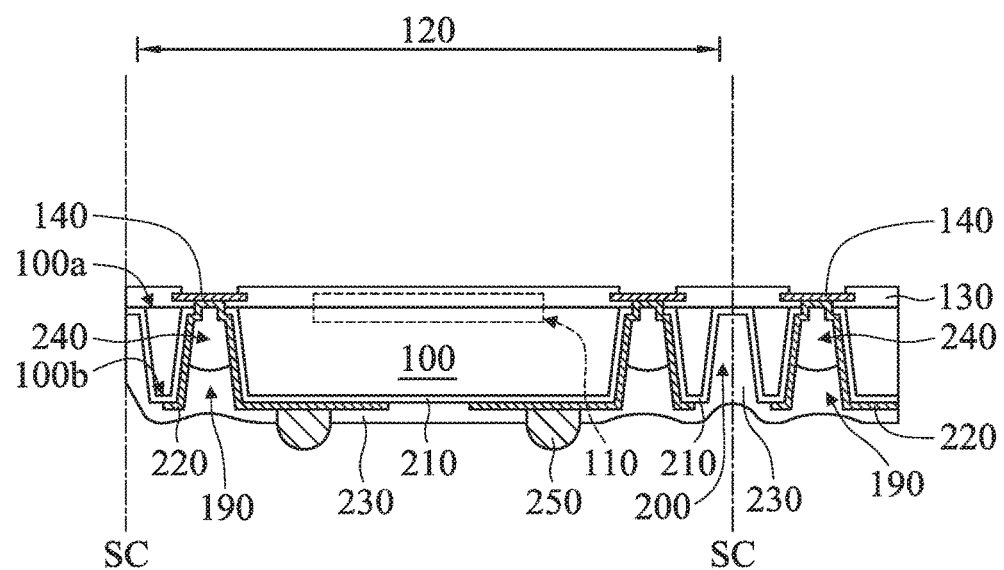
Figure 1F:
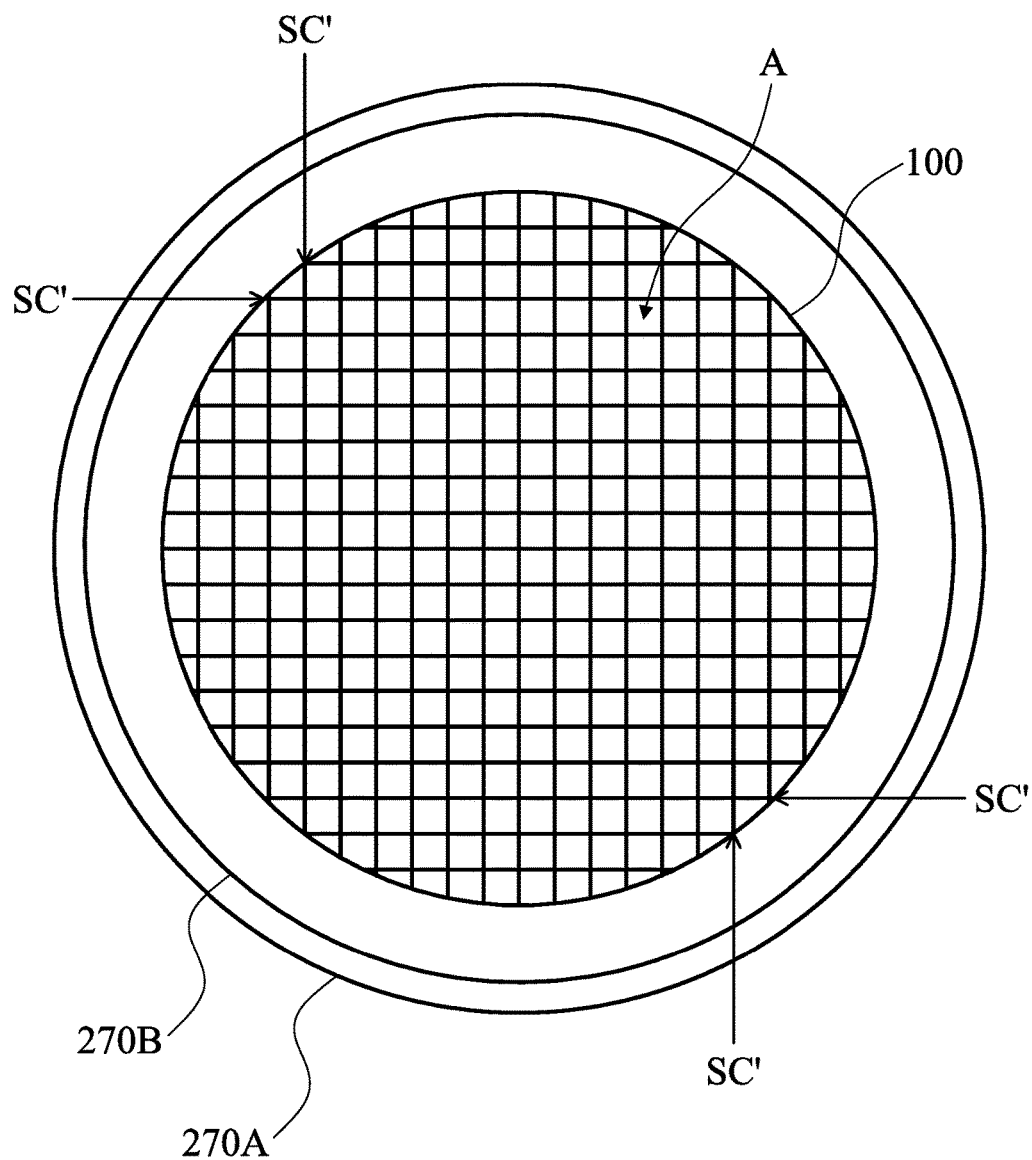
FIG. 1F is a top view of some exemplary embodiments of a method for forming a sensing device according to the invention.

Some exemplary embodiments of a method for forming a sensing device according to the invention are illustrated in FIGS. 1A to 1I. FIGS. 1A to 1E and 1G to 1I are cross-sectional views of some exemplary embodiments of a method for forming a sensing device according to the invention. FIG. 1F is a top view of some exemplary embodiments of a method for forming a sensing device according to the invention.

Referring to FIG. 1A, a first substrate 100 is provided. The first substrate 100 has a first surface 100a and a second surface 100b opposite to the first surface 100a. The first substrate 100 comprises multiple chip regions 120. To simplify the diagram, only a complete chip region 120 and a partial chip region 120 adjacent thereto are depicted herein. In some embodiments, the first substrate 100 may be a silicon substrate or another semiconductor substrate. In some other embodiments, the first substrate 100 may be a silicon wafer so as to facilitate the wafer-level packaging process.

There is an insulating layer 130 on the first surface 100a of the first substrate 100. In general, the insulating layer 130 may be made of an interlayer dielectric (ILD) layer, intermetal dielectric (IMD) layers and a covering passivation layer. To simplify the diagram, only a single insulating layer 130 is depicted herein. In some embodiments, the insulating layer 130 may comprise an inorganic material, such as silicon oxide, silicon nitride, silicon oxynitride, metal oxide, a combination thereof, or another suitable insulating material.

In some embodiments, one or more conducting pads 140 are located in the insulating layer 130 in each of the chip regions 120. In some embodiments, the conducting pads 140 may be a single conducting layer or comprise multiple conducting layers. To simplify the diagram, only a single conducting layer is depicted herein as an example. In some embodiments, the insulating layer 130 in each of the chip regions 120 comprises one or more openings exposing the corresponding conducting pads 140 so as to perform a pre-test through the exposed conducting pads 140.

In some embodiments, a sensing region 110 is located in each of the chip regions 120. The sensing region 110 may be adjacent to the insulating layer 130 and the first surface 100a of the first substrate 100. The sensing region 110 may be electrically connected to the conducting pads 140 through interconnection structures (not shown). In some embodiments, the sensing region 110 is configured to sense biometrics. The sensing region 110 may comprise a fingerprint-recognition element (such as a capacitive or optical fingerprint-recognition element). In some other embodiments, the sensing region 110 may comprise a light-sensing element, a temperature-sensing element, a humidity-sensing element, a pressure-sensing element, a capacitance-sensing element, or another suitable sensing element.

In some embodiments, the aforementioned structure may be fabricated by sequentially performing a front-end process and a back-end process of a semiconductor device. For example, integrated circuits may be formed in the first substrate 100 during the front-end process. The insulating layer 130, the interconnection structures, and the conducting pads 140 may be formed on the first substrate 100 during the back-end process. In other words, the following method for forming a sensing device proceeds to subsequent packaging processes on the aforementioned structure after the back-end process is completed.

Afterwards, a temporary cover plate 170 is bonded to the first substrate 100 by a temporary adhesive layer 165 (such as a removable tape). The temporary cover plate 170 covers the sensing region 110 and the conducting pads 140. The temporary cover plate 170 is used to provide support and protection during the subsequent packaging processes. In some embodiments, the temporary cover plate 170 may comprise glass, a semiconductor material (such as silicon) or another suitable substrate material. In some embodiments, the temporary cover plate 170 has a size (such as the width and/or the length) that is substantially the same as that of the first substrate 100.

In some embodiments, the temporary adhesive layer 165 is double-sided tape or another suitable removable adhesive material. In some embodiments, the temporary adhesive layer 165 formed between the temporary cover plate 170 and the first substrate 100 completely covers the first surface 100a of the first substrate 100. As a result, the temporary adhesive layer 165 covers the conducting pads 140 and the sensing region 110.

Referring to FIG. 1B, a thinning process (such as an etching process, a milling process, a grinding process or a polishing process) using the temporary cover plate 170 as a carrier substrate is performed on the second surface 100b of the first substrate 100. As a result, the thickness of the first substrate 100 is reduced. For example, the first substrate 100 may have a thinned thickness that is less than about 100 μm (such as about 85 μm).

Afterwards, multiple first openings 190 and a second opening 200 may be formed in the first substrate 100 in each of the chip regions 120. The first openings 190 and the second opening 200 expose the insulating layer 130 from the second surface 100b of the first substrate 100. In some embodiments, the first openings 190 and the second opening 200 are simultaneously formed by a lithography process and an etching process (such as a dry etching process, a wet etching process, a plasma etching process, a reactive ion etching process, or another suitable process). In some other embodiments, the first openings 190 may be formed by a notching process, while the second opening 200 may be formed by lithography and etching processes.

In some embodiments, the first openings 190 correspond to the conducting pads 140 and penetrate the first substrate 100. In some embodiments, the diameter of the first openings 190 adjacent to the first surface 100a is less than that of the first openings 190 adjacent to the second surface 100b. Therefore, the first openings 190 have sidewalls that are inclined to the first surface 100a and the second surface 100b. As a result, the difficulty of the process for subsequently forming layers in the first openings 190 is reduced, and reliability is improved. For example, since the diameter of the first openings 190 adjacent to the first surface 100a is less than that of the first openings 190 adjacent to the second surface 100b, layers (such as an insulating layer 210 and a redistribution layer 220) that are subsequently formed in the first openings 190 can be easily deposited on a corner between the first openings 190 and the insulating layer 130 to avoid affecting electrical connection paths or inducing problems with leakage current.

In some embodiments, the second opening 200 extends along the scribe lines SC between the adjacent chip regions 120 and penetrates the first substrate 100. As a result, portions of the first substrate 100 in the chip regions 120 are separated from each other. In some embodiments, multiple openings 190 in two adjacent chip regions 120 are arranged apart along the second opening 200. The first openings 190 and the second opening 200 are spaced apart or completely isolated from each other by a portion of the first substrate 100 (such as a sidewall portion). In some embodiments, the second opening 200 extends along the chip regions 120 and continuously surrounds the first openings 190.

In some other embodiments, the first openings 190 and the second opening 200 are in communication with each other. For example, a portion of the first openings 190 adjacent to the second surface 100b and a portion of the second opening 200 adjacent to the second surface 100b are in communication with each other. As a result, the first substrate 100 has a sidewall portion that is lower than the second surface 100b. In other words, the thickness of the sidewall portion is less than the thickness of the first substrate 100.

In some embodiments, since the first openings 190 and the second opening 200 are in communication with each other without being completely isolated from each other through a portion of the first substrate 100, it is possible to avoid the buildup of stress in the first substrate 100 between the first openings 190 and the second opening 200. Stress can be mitigated and released through the second opening 200, thereby preventing the sidewall portions of the first substrate 100 from cracking.

In some embodiments, the top-view profile of the first openings 190 is different from that of the second opening 200. For example, the top-view profile of the first openings 190 is circular while the top-view profile of the second opening 200 is rectangular. It should be realized that the top-view profiles of the first openings 190 and the second opening 200 may be another shape, and they are not limited thereto.

Referring to FIG. 1C, an insulating layer 210 may be formed on the second surface 100b of the first substrate 100 by a deposition process (such as a coating process, a physical vapor deposition process, a chemical vapor deposition process or another suitable process). The insulating layer 210 fills the first openings 190 and the second opening 200. In some embodiments, the insulating layer 210 is conformally deposited on the sidewalls and the bottoms of the first openings 190 and the second opening 200.

In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or another suitable insulating material.

Afterwards, portions of the insulating layer 210 on the bottom of the first openings 190 and the underlying insulating layer 130 are removed by lithography and etching processes. As a result, the first openings 190 extend further into the insulating layer 130 and expose the corresponding conducting pads 140.

A patterned redistribution layer 220 is formed on the insulating layer 210 by a deposition process (such as a coating process, a physical vapor deposition process, a chemical vapor deposition process, an electroplating process, an electroless plating process or another suitable process) and lithography and etching processes. The redistribution layer 220 conformally extends to the sidewalls and the bottoms of the first openings 190 without extending into the second opening 200. The redistribution layer 220 extends further onto the second surface 100b between the first openings 190 and the second opening 200.

The redistribution layer 220 is electrically isolated from the first substrate 100 by the insulating layer 210. The redistribution layer 220 may be in direct electrical contact with or indirectly electrically connected to the exposed conducting pads 140 through the first openings 190. As a result, the redistribution layer 220 in the first openings 190 is also referred to as a through silicon via (TSV). In some other embodiments, the redistribution layer 220 is electrically connected to the corresponding conducting pads 140 through T-type contact or another suitable way. In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1D, a protection layer 230 may be formed on the second surface 100b of the first substrate 100 by a deposition process. The protection layer 230 fills the first openings 190 and the second opening 200 to cover the redistribution layer 220. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the first openings 190 are not completely filled with the protection layer 230, so that a hole 240 is formed between the redistribution layer 220 and the protection layer 230 within the first openings 190. Since the protection layer 230 partially fills the first openings 190 and leaves the hole 240, the hole 240 can be a buffer between the redistribution layer 220 and the protection layer 230 in thermal cycles induced in subsequent processes. Undesirable stress, which is induced between the redistribution layer 220 and the protection layer 230 as a result of mismatched thermal expansion coefficients, is reduced. The redistribution layer 220 is prevented from being excessively pulled by the protection layer 230 when external temperature or pressure dramatically changes. As a result, problems of the redistribution layer 220, which is close to the conducting pad structure, peeling or disconnecting are avoidable. In some embodiments, the interface between the protection layer 230 and the hole 240 has an arcuate contour. In some other embodiments, the first openings 190 may be completely filled with the protection layer 230.

Next, openings may be formed in the protection layer 230 on the second surface 100b of the first substrate 100 by lithography and etching processes so as to expose portions of the redistribution layer 220. Subsequently, conducting structures 250 (such as solder balls, bumps or conductive pillars) may be filled in the openings of the protection layer 230 by an electroplating process, a screen printing process or another suitable process to electrically connect to the exposed redistribution layer 220. In some embodiments, the conducting structures 250 may comprise tin, lead, copper, gold, nickel, or a combination thereof.

Referring to FIG. 1E, after the formation of the conducting structures 250, the temporary adhesive layer 165 and the temporary cover plate 170 are removed to expose the insulating layer 130. In some embodiments, the adhesion of the temporary adhesive layer 165 is eliminated by heat so as to separate and debond the temporary cover plate 170. For example, ultraviolet (UV) radiation may be used to heat the temporary adhesive layer 165.

Next, the first substrate 100 is carried on a supporting substrate. In some embodiments, the supporting substrate comprises a frame 270A and a dicing tape 270B surrounded by the frame 270A, as shown in FIG. 1F. Afterwards, the protection layer 230 and the insulating layer 130 are diced along the scribe lines SC (i.e. along the second opening 200). As a result, multiple separated substructures A are formed. For example, a cutting tool or laser may be used to perform the dicing process. A laser cutting process can be performed in order to avoid displacement of upper and lower layers.

In some embodiments, the first substrate 100 is a wafer-level scale substrate. The first substrate 100 can be diced into multiple chip-level scale substructures A. The chip-level scale substructures A are electrically insulated from each other. In some embodiments, the separated first substrate 100 and the diced insulating layer 130 are referred to as a chip/die. In some embodiments, a trench SC' is formed along the scribe lines SC after the dicing process. The trench SC' extends between the sensing region 110 of the chip regions 120 and between the conducting structures 250. The trench SC' exposes a portion of the supporting substrate, such as the dicing tape 270B, as shown in FIG. 1F.

In some embodiments, the substructures A are carried by the supporting substrate to directly transport the substructures A after the dicing process. In some embodiments, a protection tape is attached onto the substructures A on the supporting substrate. As a result, the entire sensing region 110 is prevented from being contaminated or damaged, which would negatively affect the sensing performance. Afterwards, the protection tape is removed. Each of the substructures A is picked up from the supporting substrate, and proceeds to subsequent processes.

Figure 1G:
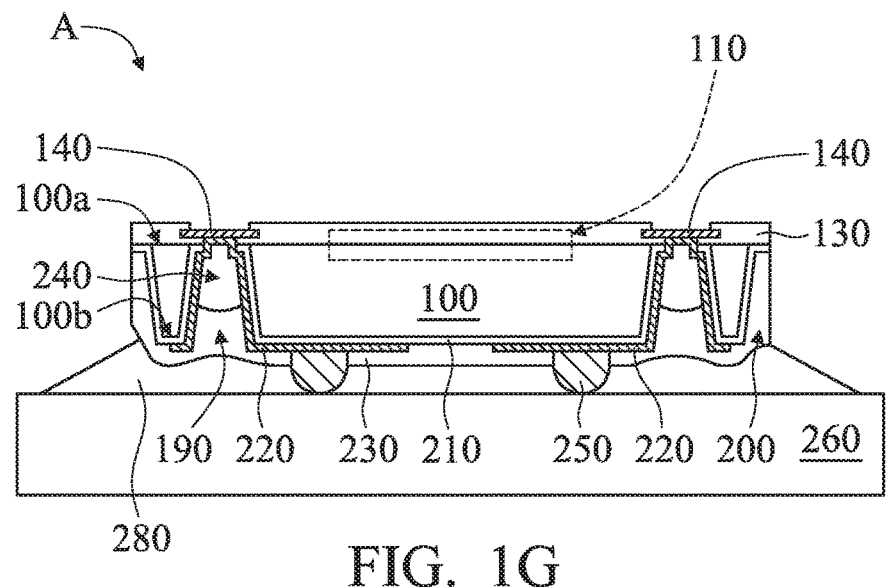

Referring to FIG. 1G, a second substrate 260 is provided. In some embodiments, the second substrate 260 comprises a circuit board, a ceramic substrate or another suitable substrate material. Afterwards, one of the substructures A is bonded onto the second substrate 260. The conducting pads 140 are electrically connected to the second substrate 260 through the redistribution layer 220 and the conducting structures 250 on the second surface 100b of the first substrate 100. For example, the conducting structures 250 may be formed of solder. After one of the substructures A is picked up from the supporting substrate and placed on the second substrate 260, a reflow process is performed so as to bond the substructure A to the second substrate 260 through solder balls.

In some embodiments, before the substructure A is bonded onto the second substrate 260, the required passive elements (such as inductors, capacitors, resistors or other electronic elements) may be formed on the second substrate 260 by surface mount technology (SMT). As a result, the substructure A is protected from outer environmental contaminants as much as possible. In some other embodiments, the substructure A and the aforementioned passive elements may be simultaneously bonded onto the second substrate 260 by the same reflow process. Alternatively, after the substructure A is bonded onto the second substrate 260, the aforementioned passive elements may be formed on the second substrate 260 bonded with the substructure A by SMT.

Subsequently, an underfill layer 280 fills into a space between or surrounded by the protection layer 230 and the second substrate 260. The underfill layer 280 may be formed by a dispensing process or another suitable process. The underfill layer 280 continuously surrounds the conducting structures 250 to protect the conducting structures 250. In some embodiments, the underfill layer 280 is separated from the redistribution layer 220 by the protection layer 230. In some embodiments, the underfill layer 280 is made of a material which has high diffusivity and high fluidity and can be heat-cured. In some embodiments, the underfill layer 280 comprises resin or another suitable material.

In some embodiments, a sidewall of the heat-cured underfill layer 280 has a curved surface due to a capillary phenomenon. In some embodiments, a space between the substructure A and the second substrate 260 is completely filled with the underfill layer 280. Furthermore, the underfill layer 280 extends beyond the edge of the substructure A and exposes a portion of the upper surface of the second substrate 260. In some other embodiments, the upper surface of the second substrate 260 is entirely covered by the underfill layer 280.

Figure 1H:
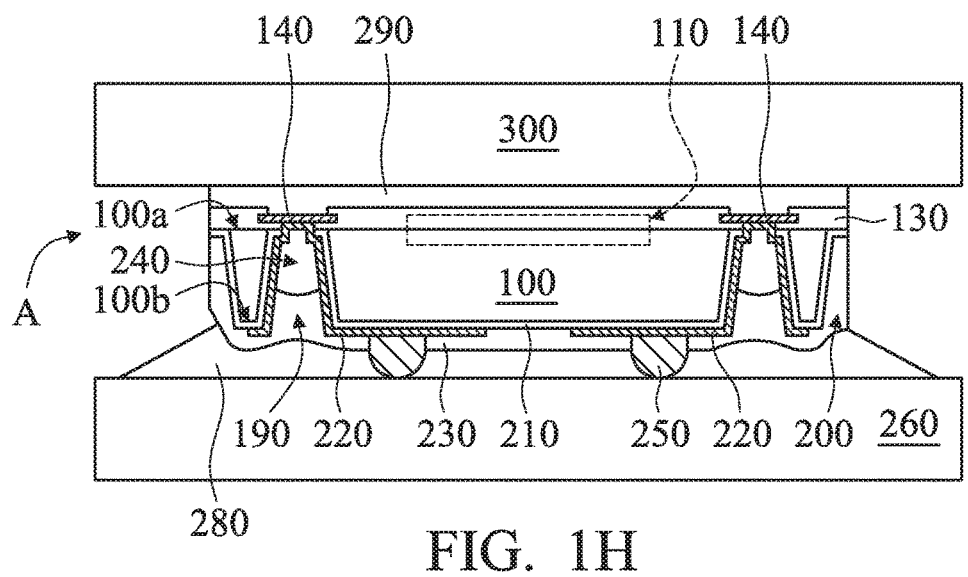
Figure 1I:
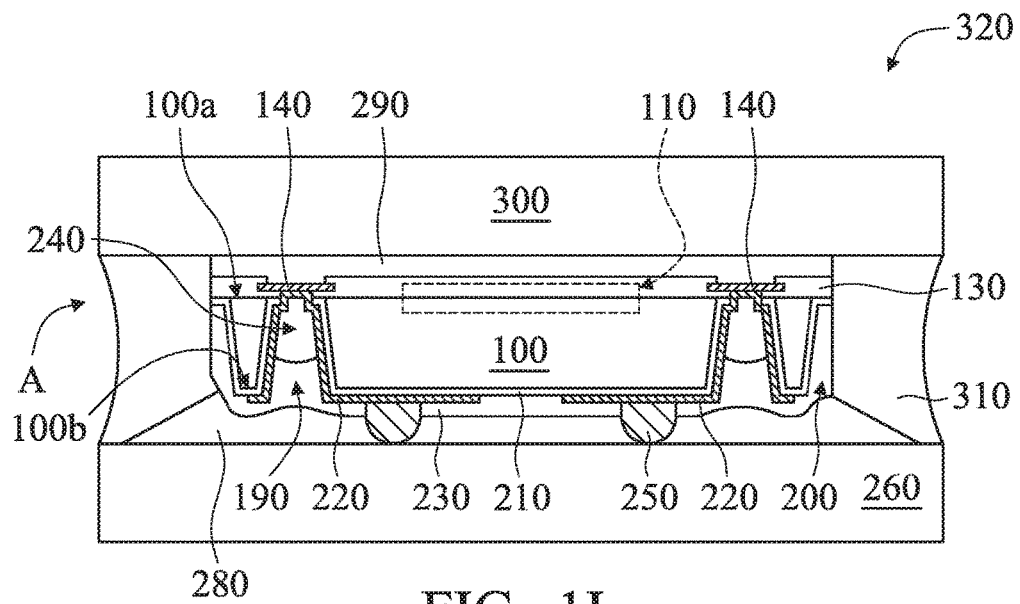

Referring to FIG. 1H, a cover plate 300 is bonded to the substructure A by an adhesive layer 290. As a result, the substructure A is between the cover plate 300 and the second substrate 260. In some embodiments, after the formation of the underfill layer 280, a test may be performed on the second substrate 260 bonded with the substructure A. The subsequent packaging processes are only performed on packaging structures of good quality. For example, the cover plate 300 of high quality and high cost is only bonded to packaging structures of good quality. Therefore, the quality of the sensing device is ensured and the fabrication cost is greatly lowered.

In some embodiments, the adhesive layer 290 comprises adhesive glue or another adhesive material. In some embodiments, the adhesive layer 290 between the substructure A and the cover plate 300 comprises a high dielectric constant (K) material to enhance the sensitivity of the sensing device.

In some embodiments, the cover plate 300 comprises sapphire or another suitable material to further provide an abrasion-resistant, scratch-proof and high-reliability surface. As a result, the sensing device can be prevented from being contaminated or damaged while the sensing functions of the sensing device are being executed. Furthermore, the cover plate 300 has shielding properties. For example, the cover plate 300 may be made of a colorful and non-transparent material.

In some embodiments, the size (such as the width and/or the length) of the cover plate 300 is greater than the size of the substructure A. In some embodiments, the size (such as the width and/or the length) of the cover plate 300 is substantially equal to the size of the second substrate 260. In some other embodiments, the size of the cover plate 300 is greater than the size of the second substrate 260. Since the size of the cover plate 300 is not less than the size of the second substrate 260, it can be ensured that the sensing device is accommodated in an electronic product. As a result, the sensing device can be combined into the electronic product.

Afterwards, an encapsulating layer 310 may be filled into a space surrounded by the cover plate 300 and the second substrate 260 by a dispensing process, a molding process or another suitable process. The encapsulating layer 310 is then heat-cured. As a result, a sensing device 320 is fabricated. The encapsulating layer 310 continuously surrounds the substructure A between the cover plate 300 and the second substrate 260 to protect the substructure A. In some embodiments, the encapsulating layer 310 further continuously surrounds the adhesive layer 290 and the underfill layer 280. The encapsulating layer 310 and the underfill layer 280 together completely fill the space between the cover plate 300 and the second substrate 260.

In some embodiments, the encapsulating layer 310 is made of a material which has high diffusivity and fluidity and can be heat-cured. In some embodiments, the encapsulating layer 310 comprises underfill material, molding compound material or another suitable material, such as resin. In some embodiments, a sidewall of the heat-cured encapsulating layer 310 has a curved surface due to a capillary phenomenon. In some embodiments, the encapsulating layer 310 extends to the sidewall of the second substrate 260.

In some embodiments, the underfill layer 280 and the encapsulating layer 310 comprise the same material. In some other embodiments, the underfill layer 280 and the encapsulating layer 310 comprise different materials. In some embodiments, there is a visible interface between the underfill layer 280 and the encapsulating layer 310. In some other embodiments, there may be no visible interface between the underfill layer 280 and the encapsulating layer 310.

Figure 2A:
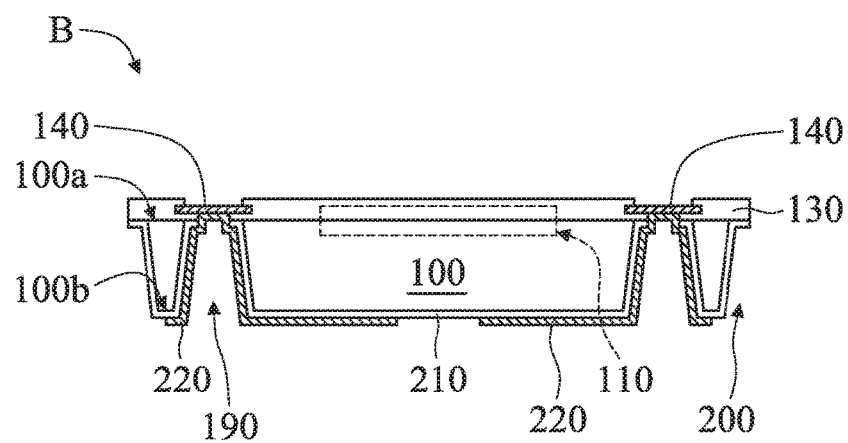
FIGS. 2A to 2C are cross-sectional views of some exemplary embodiments of a method for forming a sensing device according to the invention.
Figure 2B:
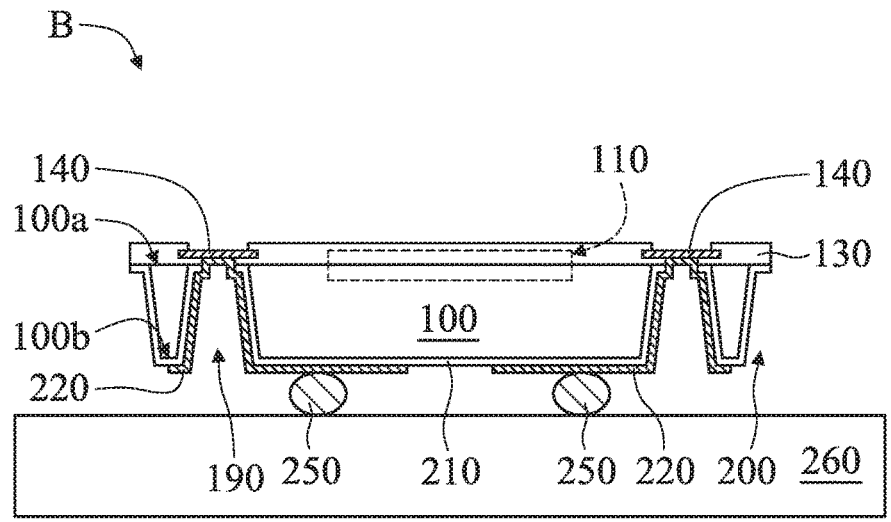
Figure 2C:
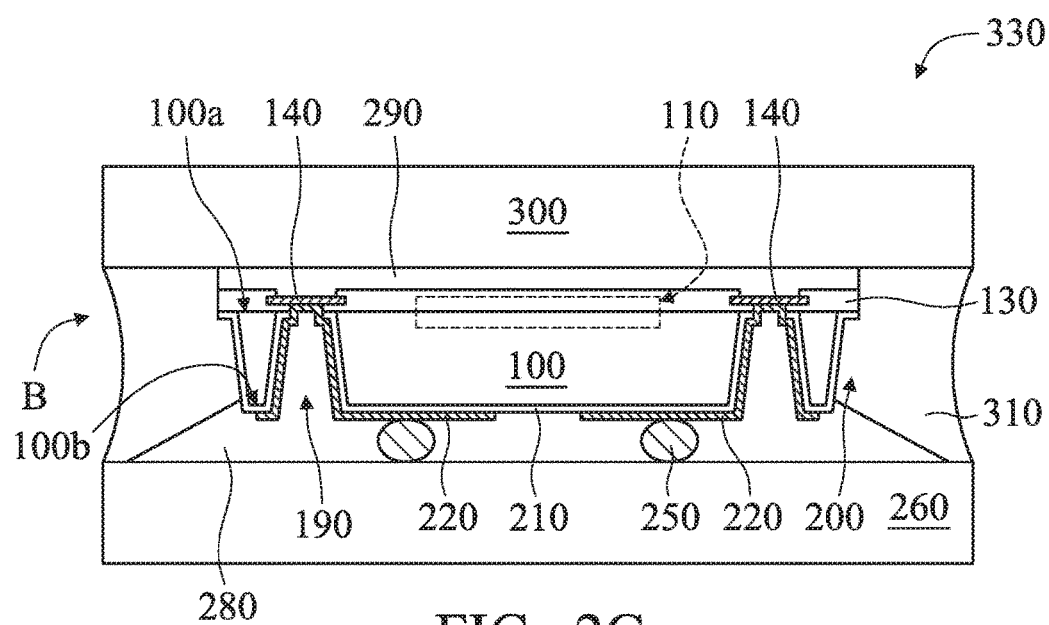

Some exemplary embodiments of a method for forming a sensing device according to the invention are illustrated in FIGS. 2A to 2C. FIGS. 2A to 2C are cross-sectional views of some exemplary embodiments of a method for forming a sensing device according to the invention. Elements in FIGS. 2A to 2C that are the same as those in FIGS. 1A to 1I are labeled with the same reference numbers as in FIGS. 1A to 1I and are not described again for brevity.

Referring to FIG. 2A, the temporary cover plate 170 is bonded to the first substrate 100 through the temporary adhesive layer 165 in steps that are the same as or similar to the steps shown in FIG. 1A. Next, a thinning process is performed on the first substrate 100, and the first openings 190 and the second opening 200 are formed in the first substrate 100 in steps that are the same as or similar to the steps shown in FIG. 1B. Subsequently, the insulating layer 210 and the redistribution layer 220 are formed on the second surface 100b of the first substrate 100 in steps that are the same as or similar to the steps shown in FIG. 1C.

Afterwards, the temporary adhesive layer 165 and the temporary cover plate 170 are removed in steps that are the same as or similar to the steps shown in FIG. 1E. Next, a dicing process is performed along the scribe lines SC (i.e. along the second opening 200) in steps that are the same as or similar to the steps shown in FIG. 1F. As a result, multiple separated substructures B are formed. In some embodiments, there is no protection layer on the second surface 100b of the first substrate 100 in the substructures B. As a result, the redistribution layer 220 is entirely exposed. In some other embodiments, a protection layer (such as the protection layer 230) may optionally be formed on the second surface 100b of the first substrate 100. The protection layer has openings exposing the redistribution layer 220.

Referring to FIG. 2B, the substructure B is bonded onto the second substrate 260, and is electrically connected to the second substrate 260 through multiple conducting structures 250 between the redistribution layer 220 and the second substrate 260. In some embodiments, the conducting structures 250 are formed using dipping flow technology. For example, the conducting structures 250 made of solder may have been previously formed on the second substrate 260 before the substructure B was bonded onto the second substrate 260. A reflow process is subsequently performed so as to bond the substructure B to the second substrate 260 through solder bumps. As a result, the height of the conducting structures 250 can be reduced, thereby facilitating a reduction of the overall size of the sensing device. Furthermore, the substructure B has an exposed redistribution layer 220. It is advantageous for the substructure B to successively electrically connect to the conducting structures 250 on the second substrate 260.

In some other embodiments, the conducting structures 250 comprise conductive glue or another adhesive conductive material so as to attach the substructure B onto the second substrate 260. Electrical connection paths are also formed by the conducting structures 250. Therefore, the height of the conducting structures 250 can be reduced even further, and there is no need to perform a reflow process which would induce contamination problems. Moreover, before the substructure B is bonded onto the second substrate 260, the required passive elements (such as inductors, capacitors, resistors or other electronic elements) may be formed on the second substrate 260 by SMT. As a result, the substructure B is protected from outer environmental contaminants as much as possible.

In some other embodiments, the substructure B and the aforementioned passive elements may be simultaneously bonded onto the second substrate 260 by the same reflow process. Alternatively, after the substructure B is bonded onto the second substrate 260, the aforementioned passive elements may be formed on the second substrate 260 bonded with the substructure B by SMT.

Referring to FIG. 2C, the underfill layer 280 is formed between the exposed redistribution layer 220 and the second substrate 260 by a dispensing process or another suitable process. The underfill layer 280 continuously surrounds the conducting structures 250 to protect the conducting structures 250. In some embodiments, the underfill layer 280 is in direct contact with the redistribution layer 220. In some embodiments, the underfill layer 280 fills up the first openings 190 and/or the second opening 200. In some embodiments, the first openings 190 and/or the second opening 200 is partially filled with the underfill layer 280. In some other embodiments, the underfill layer 280 does not fill in the first openings 190 and/or the second opening 200.

Afterwards, the cover plate 300 is bonded onto the substructure B through the adhesive layer 290 in steps that are the same as or similar to the steps shown in FIG. 1H. As a result, the substructure B is between the cover plate 300 and the second substrate 260. Subsequently, the encapsulating layer 310 is filled into a space surrounded by the cover plate 300 and the second substrate 260 in steps that are the same as or similar to the steps shown in FIG. 1I. As a result, a sensing device 330 is fabricated.

According to the aforementioned embodiments, the fabrication of a sensing device is simple. The sensing chip and the required passive elements are incorporated into the same sensing device. In some embodiments, the sensing device is electrically connected to the second substrate through TSVs (i.e., the redistribution layer in the first openings) without performing wire bonding processes to form wires. Accordingly, the fabrication cost is significantly lowered. The size of the sensing device is also reduced. It is more advantageous to provide the sensing device with a flat sensing surface.

Moreover, the temporary cover plate is used to provide protection and support during the fabrication of the sensing device. The sensing region can be prevented from being contaminated and its sensing performance is not negatively affected. Bending or warpage of the first substrate can also be prevented. It is advantageous to provide a flat surface for executing the sensing functions of the sensing device.

Furthermore, the temporary cover plate is removed before the dicing process (i.e., during the wafer-level packaging process), rather than after the dicing process. As a result, the fabrication of the sensing device becomes simpler. The difficulty of the process for removing the temporary cover plate and the dicing process is reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a sensing device, comprising:
providing a first substrate, wherein the first substrate has a first surface and a second surface opposite to the first surface, and wherein a sensing region is adjacent to the first surface;
providing a temporary cover plate over the first surface to cover the sensing region;
forming a redistribution layer over the second surface, wherein the redistribution layer is electrically connected to the sensing region;
removing the temporary cover plate after the formation of the redistribution layer;
bonding the first substrate to a second substrate and a cover plate after the removal of the temporary cover plate, so that the first substrate is between the second substrate and the cover plate, wherein the redistribution layer is electrically connected to the second substrate; and
filling an encapsulating layer between the second substrate and the cover plate to surround the first substrate.

2. The method for forming a sensing device as claimed in claim 1, further comprising thinning the first substrate from the second surface before the formation of the redistribution layer.

3. The method for forming a sensing device as claimed in claim 1, further comprising performing a dicing process after the removal of the temporary cover plate.

4. The method for forming a sensing device as claimed in claim 1, further comprising forming a conducting structure, wherein the conducting structure is between the redistribution layer and the second substrate, and the first substrate is bonded to the second substrate through the conducting structure.

5. The method for forming a sensing device as claimed in claim 4, wherein the conducting structure is formed over the redistribution layer before bonding the first substrate to the second substrate.

6. The method for forming a sensing device as claimed in claim 4, wherein the conducting structure is formed over the second substrate before bonding the first substrate to the second substrate.

7. The method for forming a sensing device as claimed in claim 1, further comprising filling an underfill layer between the first substrate and the second substrate after bonding the first substrate to the second substrate and before bonding the first substrate to the cover plate.

8. The method for forming a sensing device as claimed in claim 7, wherein the encapsulating layer further surrounds the underfill layer.

9. The method for forming a sensing device as claimed in claim 1, wherein the first substrate is bonded to the cover plate through an adhesive layer.

10. The method for forming a sensing device as claimed in claim 1, wherein the sensing region comprises a biometrics sensing element.

11. The method for forming a sensing device as claimed in claim 1, wherein the sensing region comprises a fingerprint-recognition element.

12. A sensing device, comprising:
a first substrate and a second substrate;
a cover plate, wherein the first substrate is between the second substrate and the cover plate;
a sensing region, wherein the sensing region is adjacent to a surface of the first substrate that faces the cover plate;
a redistribution layer, wherein the redistribution layer is between the first substrate and the second substrate, and wherein the redistribution layer is electrically connected to the sensing region and the second substrate;
an underfill layer, wherein the underfill layer is between the redistribution layer and the second substrate; and
an encapsulating layer, wherein the encapsulating layer surrounds the first substrate and the underfill layer.

13. The sensing device as claimed in claim 12, wherein the cover plate is non-transparent.

14. The sensing device as claimed in claim 12, wherein the cover plate comprises sapphire.

15. The sensing device as claimed in claim 12, further comprising a conducting structure, wherein the conducting structure is between the redistribution layer and the second substrate, and the conducting structure is surrounded by the underfill layer.

16. The sensing device as claimed in claim 12, further comprising an adhesive layer, wherein the adhesive layer is between the first substrate and the cover plate, and the adhesive layer comprises a high-K material.

17. The sensing device as claimed in claim 16, wherein the underfill layer further surrounds the adhesive layer.

18. The sensing device as claimed in claim 12, wherein the sensing region comprises a biometrics sensing element.

19. The sensing device as claimed in claim 12, wherein the sensing region comprises a fingerprint-recognition element.

* * * * *